United States Patent
Yeh et al.

(10) Patent No.: US 6,566,151 B2
(45) Date of Patent: May 20, 2003

(54) METHOD OF FORMING A COLOR FILTER

(75) Inventors: Cheng-Pang Yeh, Tainan (TW); Ching-Chung Chen, Hsi-Chih (TW)

(73) Assignee: United Microelectronics Corp., Hsin-Chu (TW)

( * ) Notice: Subject to any disclaimer, the term of this patent is extended or adjusted under 35 U.S.C. 154(b) by 40 days.

(21) Appl. No.: 09/885,047

(22) Filed: Jun. 21, 2001

(65) Prior Publication Data

US 2002/0197753 A1 Dec. 26, 2002

(51) Int. Cl.⁷ .............................................. H01L 21/00
(52) U.S. Cl. ............................ 438/21; 438/70; 438/65
(58) Field of Search ........................... 438/21, 70, 65, 438/68, 35, 72, 75, 69

(56) References Cited

U.S. PATENT DOCUMENTS

| | | | | |
|---|---|---|---|---|
| 5,954,559 A | * | 9/1999 | Holmberg et al. | 430/7 |
| 6,083,666 A | * | 7/2000 | Kim | 438/613 |
| 6,100,953 A | * | 8/2000 | Kim et al. | 349/122 |
| 6,171,885 B1 | * | 1/2001 | Fan et al. | 438/70 |
| 6,180,430 B1 | * | 1/2001 | Kong et al. | 438/29 |
| 6,188,094 B1 | * | 2/2001 | Kochi et al. | 257/232 |
| 6,200,712 B1 | * | 3/2001 | Fan et al. | 438/70 |
| 6,242,730 B1 | * | 6/2001 | Lin et al. | 250/208.1 |
| 6,274,917 B1 | * | 8/2001 | Fan et al. | 257/232 |
| 6,285,065 B1 | * | 9/2001 | Levy | 430/7 |
| 6,287,733 B1 | * | 9/2001 | Miyazaki et al. | 430/7 |
| 6,344,369 B1 | * | 2/2002 | Huang et al. | 438/70 |
| 6,395,576 B1 | * | 5/2002 | Chang et al. | 438/65 |

* cited by examiner

*Primary Examiner*—John F. Niebling
*Assistant Examiner*—Walter L. Lindsay, Jr.
(74) *Attorney, Agent, or Firm*—Winston Hsu (57) ABSTRACT

The present invention provides a method for increasing the adhesion of a color filter on a semiconductor wafer. The semiconductor wafer comprises a substrate, a plurality of MOS transistor sensors positioned on the substrate, and a plurality of insulators formed between two MOS transistor sensors on the substrate. The present invention first involves forming a dielectric layer on the semiconductor wafer, which covers each MOS transistor sensor and each insulator. Thereafter, a passivation layer is formed on the dielectric layer, and a plurality of recesses is formed in the passivation layer corresponding to a MOS transistor sensor. Finally, a color filter is formed in each recess. The recess is used to increase the contact areas between the color filter and the passivation layer so as to prevent stripping of the color filter.

7 Claims, 7 Drawing Sheets

METHOD OF FORMING A COLOR FILTER

FIELD OF THE INVENTION

The present invention relates to a method of manufacturing a color filter, and more particularly, to a method of increasing the adhesion of color filters on the semiconductor wafer.

DESCRIPTION OF THE PRIOR ART

Charge-coupled device (CCDs) have been the mainstay of conventional imaging circuits for converting light into an electrical signal. The applications of CCDs include monitors, transcription machines and cameras. Although CCDs have many advantages, CCDs also suffer from high costs and the limitations imposed by its volume. To overcome the weakness of CCDs and reduce costs and dimensions, a CMOS photodiode device is developed. Since a CMOS photodiode device can be produced by using conventional techniques, both cost and the volume of the sensor can be reduced. The applications of CMOS photodiodes include PC cameras, digital cameras, etc.

Whether the image sensor device is composed of a CCD or CMOS photodiode, the incident light must be separated into a combination of light of different wave lengths, for example, red, blue and green light. Then, the light is received by corresponding sensor devices and is transformed into electrical signals so as to obtain the original color of incident light by returning the electrical signals. Therefore, a color filter array must be formed on each photosensor device. Currently, color filters are produced by either patterning photosensitive resins using a photo-etching process with the resultant patterns being dyed by a dyeing material, or a photoresist containing dyeing material is directly used to produce color filters.

Figure 1:
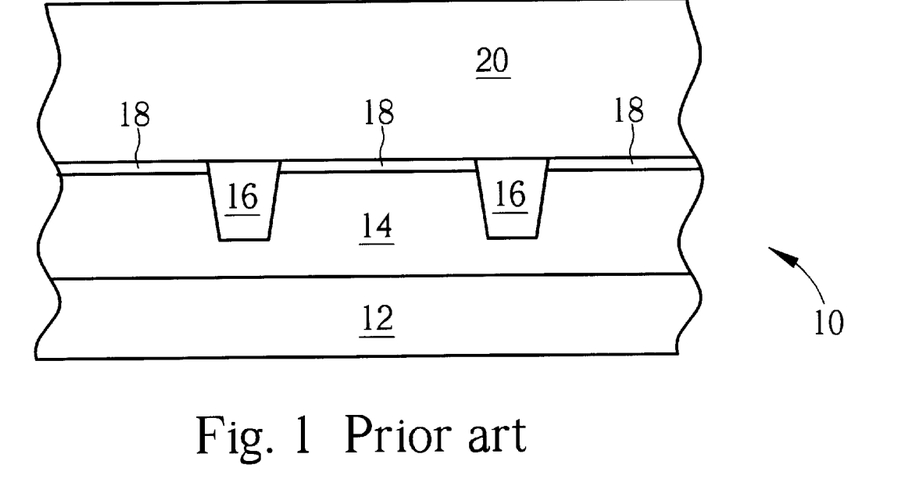
FIG. 1 to FIG. 6 are cross-sectional diagrams of manufacturing a color filter array according to the prior art method.

Please refer to FIG. 1 to FIG. 6. FIG. 1 to FIG. 6 are cross-sectional diagrams of manufacturing a color filter array on a photosensor device according to the prior art method. As shown in FIG. 1, the semiconductor wafer 10 contains a silicon substrate 12 and a P-well 14 positioned on the silicon substrate 12. The photosensor device contains a plurality of CMOS photodiodes and each photodiode contains a metal-oxide semiconductor (MOS) transistor (not shown) positioned on the P-well 14. A photosensor area 18 is formed on the P-well 14 to electrically connect with the MOS transistor. The MOS transistor is a complementary metal-oxide semiconductor (CMOS) transistor composed of an NMOS transistor and a PMOS transistor and functions as a CMOS transistor sensor. The semiconductor wafer 10 also contains a plurality of field oxide layers or shallow trench isolation (STI) structures 16 positioned on the silicon substrate 12 that surrounds the photosensor area 18. The STI structures 16 act as a dielectric insulating material to prevent short circuiting due to contact between the photosensor areas 18 and other units.

Figure 2:
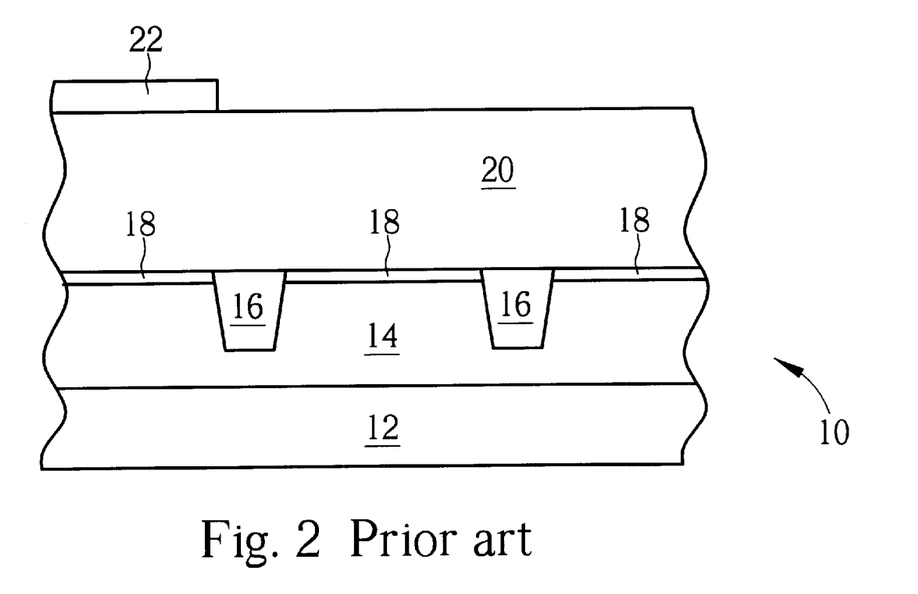

First, a passivation layer 20 is formed on the surface of the semiconductor wafer 10 that covers each photosensor area 18. Next, as shown in FIG. 2, a red color filter layer (not shown) is formed on the surface of the semiconductor wafer 10. The color filter layer is composed of a positive type photoresist containing a red dye in a large amount (dry weight) of 10 to 50 wt %. A pattern-exposure process is used to form patterns of red color filters in the color filter layer, then the exposed portions of the filter layer is removed to form each red color filter 22. For increasing the effect and reliability of color filters, an ultraviolet (UV) light irradiation and heating process is performed after the formation of the red color filters 22. The UV light used has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature of the heating process is between a range of 60° C. to 140° C. Then, an average increasing temperature rate used in the heating process is 1.5° C./sec. The end temperature of the heating process is between a range of 160° C. to 220° C.

Figure 3:
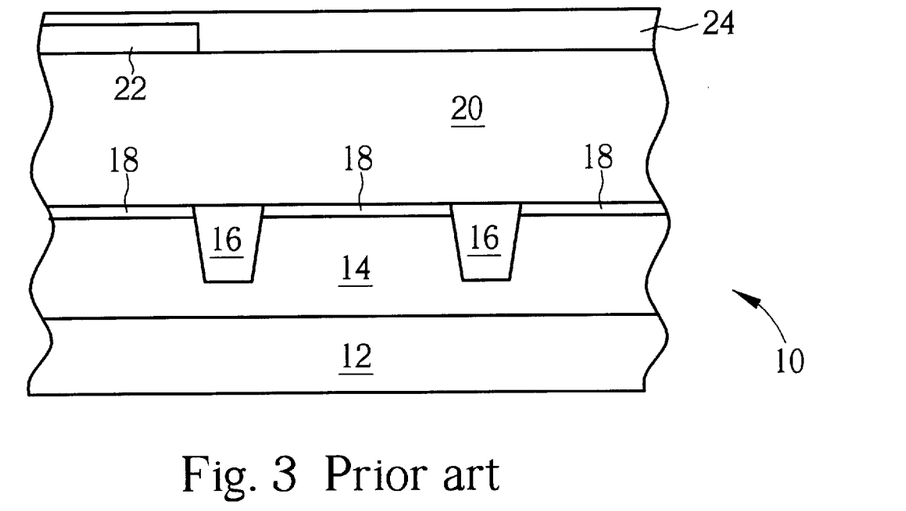
Figure 4:
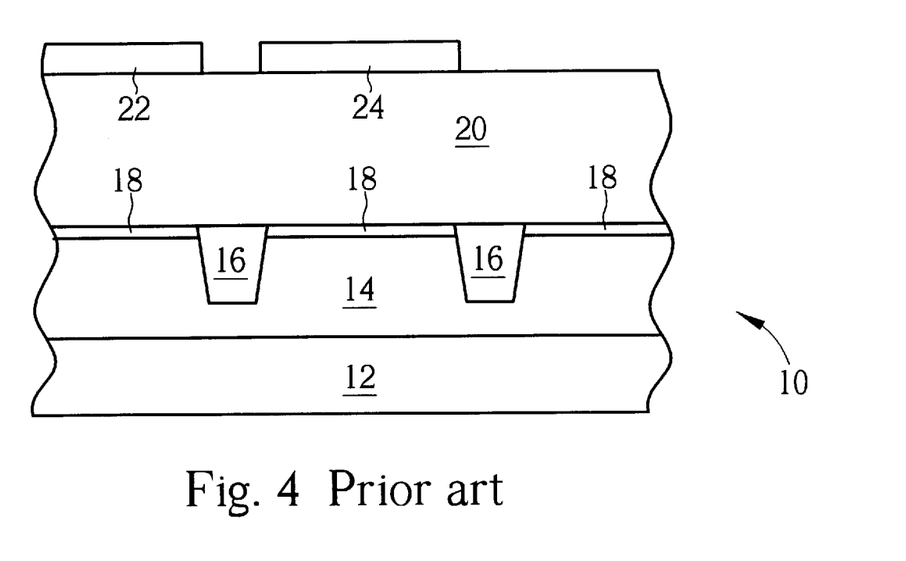

Next, green and blue color filters are formed by repeating the above-mentioned processes. As shown in FIG. 3, a green color filter layer 24 is formed on the surface of the semiconductor wafer 10. The color filter layer 24 is composed of a positive type photoresist containing a green dye in a large amount (dry weight) of 10 to 50 wt %. As shown in FIG. 4, a pattern-exposure process is used to form patterns of green color filters in the color filter layer 24, then the exposed portions of the filter layer 24 is removed to form each green color filter 26. For increasing the effect and reliability of color filters, a UV light irradiation and heating process is also performed after the formation of the green color filters 26. The UV light used has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature of the heating process is between a range of 60° C. to 140° C. Then, an average increasing temperature rate used in the heating process is 1.5° C./sec. The end temperature of the heating process is between a range of 160° C. to 220° C.

Figure 5:
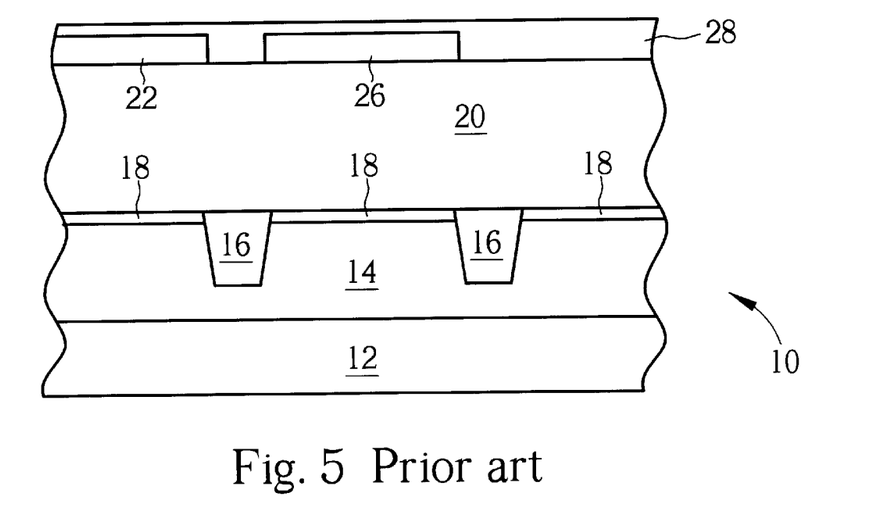
Figure 6:
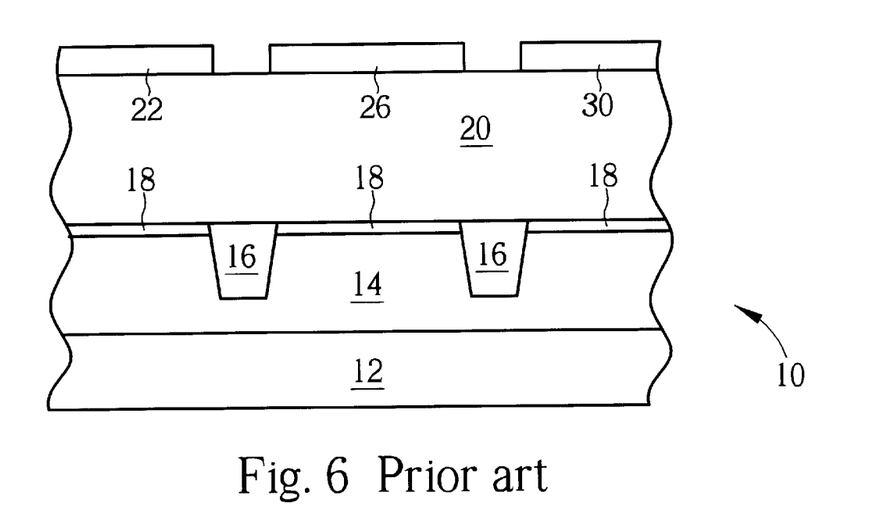

As shown in FIG. 5, a blue color filter layer 28 is formed on the surface of the semiconductor wafer 10. The color filter layer 28 is composed of a positive type photoresist containing a blue dye in a large amount (dry weight) of 10 to 50 wt %. As shown in FIG. 6, a pattern-exposure process is used to form patterns of blue color filters in the color filter layer 28, then the exposed portions of the filter layer 28 is removed to form each blue color filter 30. For increasing the effect and reliability of color filters, a UV light irradiation and heating process is also performed after the formation of the blue color filters 30. The UV light used has a wavelength of 320 nm or less at a quantity of 20 J/cm$^2$ or less. The heating process is preferably performed in an inert atmosphere, for example, in nitrogen (N2) for suppressing the oxidation of the photoresist material. The starting temperature of the heating process is between a range of 60° C. to 140° C. Then, an average increasing temperature rate used in the heating process is 1.5° C./sec. The end temperature of the heating process is between a range of 160° C. to 220° C. The color filter array of a photosensor device produced by the prior art method is then completed.

As the resolution of the photosensor device increases, the dimension of each element in the photosensor device correspondingly decreases. Due to reduction of color filter dimension, the contact area between the color filter and the passivation layer is decreased and results in adhesion weakness. As well, the thickness of the color filter is also decreased to lead to the occurrence of cross-talk in the photosensor device.

SUMMARY OF THE INVENTION

It is therefore a primary objective of the present invention to provide a method of manufacturing a color filter for increasing the contact area between the color filter and the passivation layer. Furthermore, the adhesion between the color filter and the passivation layer is enhanced so as to prevent stripping of the color filter.

The present invention provides a method for increasing the adhesion of a color filter on a semiconductor wafer. The semiconductor wafer comprises a substrate, a plurality of MOS transistor sensors positioned on the substrate, and a plurality of insulators formed between two MOS transistor sensors on the substrate. The present invention first involves forming a dielectric layer on the semiconductor wafer, which covers each MOS transistor sensor and each insulator. Thereafter, a passivation layer is formed on the dielectric layer, and a plurality of recesses are formed in the passivation layer and positioned above a corresponding MOS transistor sensor. Finally, a color filter is formed in each recess. The recess is used to increase the contact areas between the color filter and the passivation layer so as to prevent stripping of the color filter.

The color filter produced by the present invention method uses a plurality of recesses formed in the passivation layer to increase the contact areas between the color filter and the passivation layer. Furthermore, the adhesion between the color filter and the passivation layer is enhanced so as to prevent the stripping of the color filter.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 7:
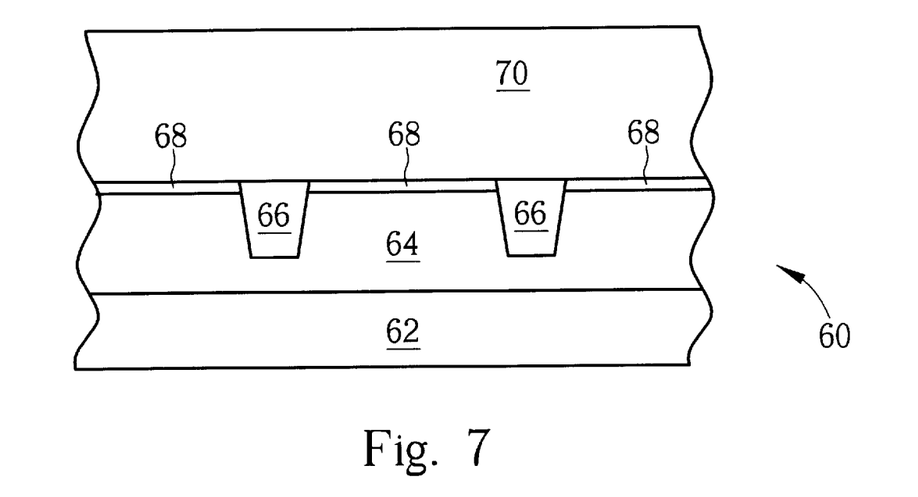
FIG. 7 to FIG. 13 are cross-sectional diagrams of manufacturing a color filter array by the present invention method.

Please refer to FIG. 7 to FIG. 13. FIG. 7 to FIG. 13 are cross-sectional diagrams of manufacturing a color filter array on a photosensor device by the present invention method. As shown in FIG. 7, the semiconductor wafer 60 contains a silicon substrate 62 and a P-well 64 positioned on the silicon substrate 62. The photosensor device contains a plurality of CMOS photodiodes and each photodiode contains a metal-oxide semiconductor (MOS) transistor (not shown) positioned on the P-well 64. A photosensor area 68 is formed on the P-well 64 to electrically connect with the MOS transistor. The MOS transistor is a complementary metal-oxide semiconductor (CMOS) transistor composed of an NMOS transistor and a PMOS transistor and functions as a CMOS transistor sensor. The semiconductor wafer 60 also contains a plurality of field oxide layers or shallow trench isolation (STI) structures 66 positioned on the silicon substrate 62 that surrounds the photosensor area 68. The STI structures 66 act as a dielectric insulating material to prevent short circuiting due to contact between the photo sensor areas 68 and other units. Firstly, a dielectric layer 70, composed of silicon-rich oxide (SRO) or spin-on glass (SOG), is formed on the surface of the semiconductor wafer 60 and covering each photosensor area 68 and the MOS transistor.

Figure 8:
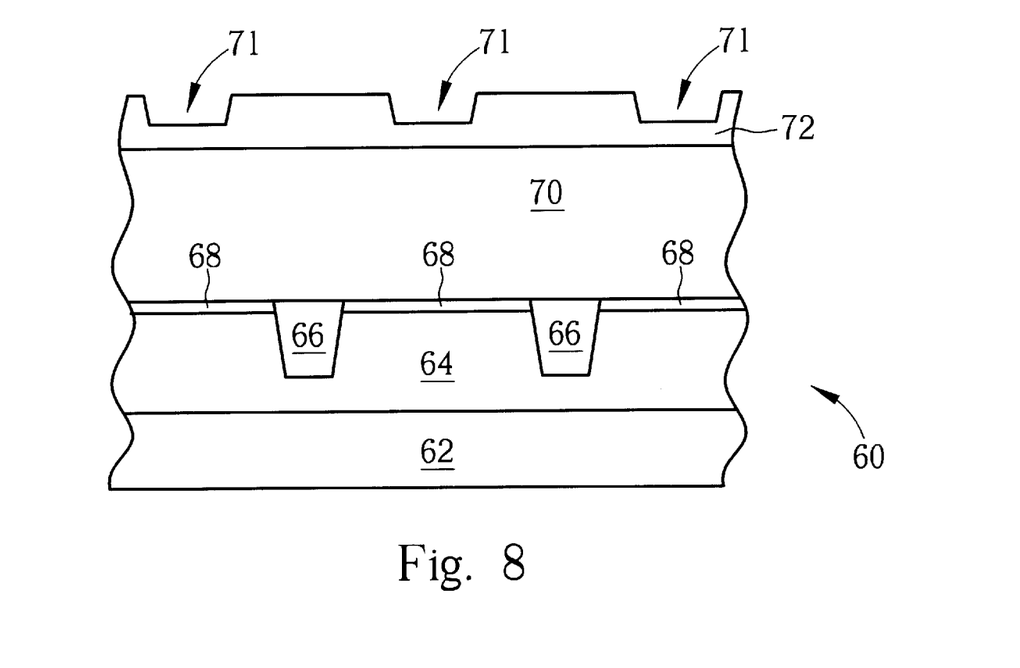
Figure 9:
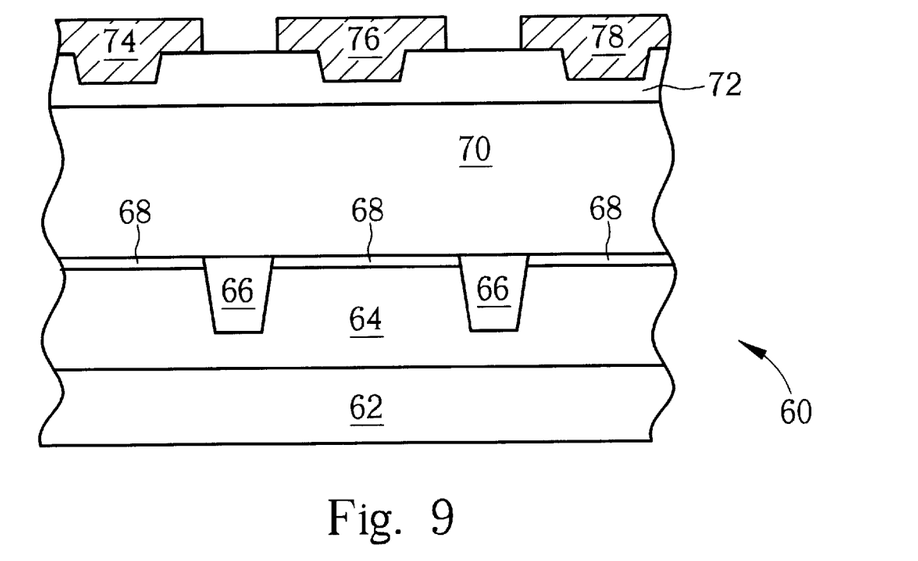

Next, as shown in FIG. 8, a passivation layer 72 composed of silicon-oxy-nitride is formed on the dielectric layer 70 and a plurality of recesses 71 are formed in the passivation layer 72. Each recess 71 is positioned above one corresponding photosensor area 68, which is electrically connected with a MOS transistor. Thereafter, as shown in FIG. 9, a red 74, green 76 and blue 78 color filter are sequentially formed in each recess 71 using a prior art method. The recess 71 is used to increase the contact areas between the color filters 74, 76, 78 and the passivation layer 72 so as to prevent stripping of the color filters 74, 76, 78.

Figure 10:
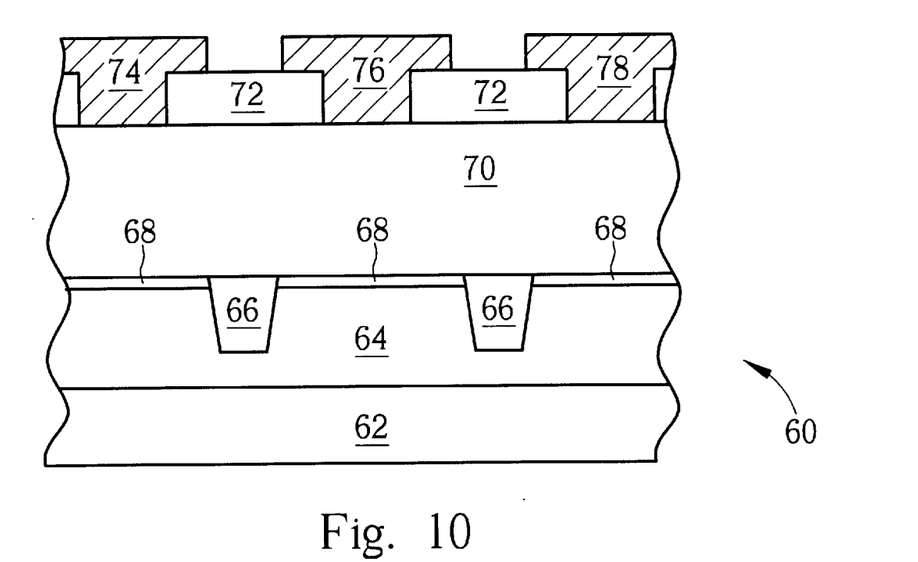
Figure 11:
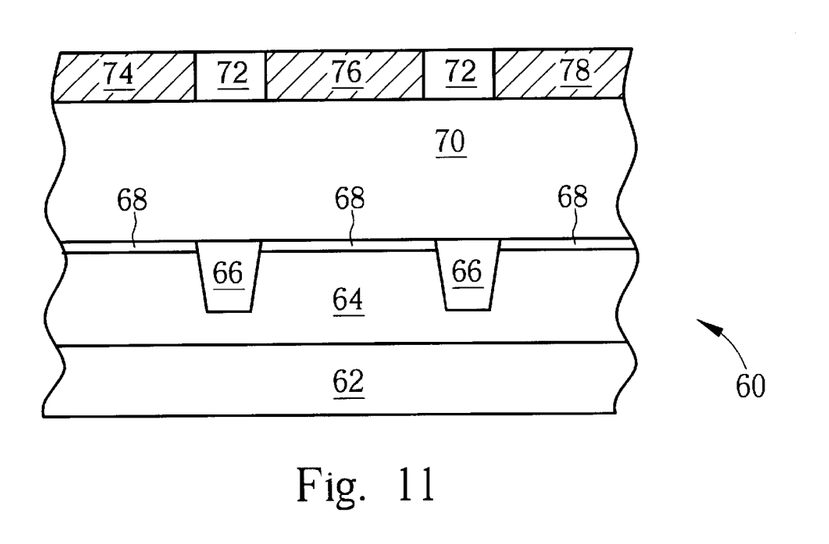

FIG. 10 and FIG. 11 are cross-sectional diagrams of the second and third embodiment according to the present invention. The second embodiment, as shown in FIG. 10, involves forming a recess 71 above each photosensor area 68 that penetrates the passivation layer 72 down to the surface of the dielectric layer 70. Then, a red 74, green 76 and blue 78 color filter are sequentially formed in each recess 71 using a prior art method. Therefore, the contact areas between each color filter 74, 76, 78 and the passivation layer 72 is significantly increased. The third embodiment, as shown in FIG. 11, involves forming a recess 71 above each photosensor area 68 that penetrates the passivation layer 72 down to the surface of the dielectric layer 70. A red 74, green 76 and blue 78 color filter are formed in each recess 71 and are approximately level with the surface of the passivation layer 72. Therefore, the incident light has only to penetrate through the color filter 74, 76, 78 and the passivation layer 72 before entering the photosensor area 68. As a result, energy loss of the incident light is reduced.

Figure 12:
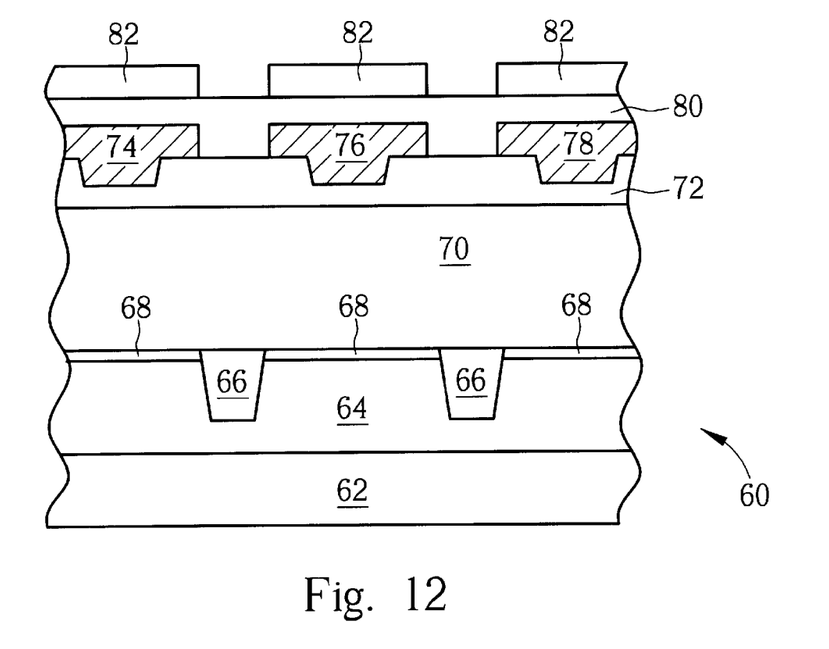
Figure 13:
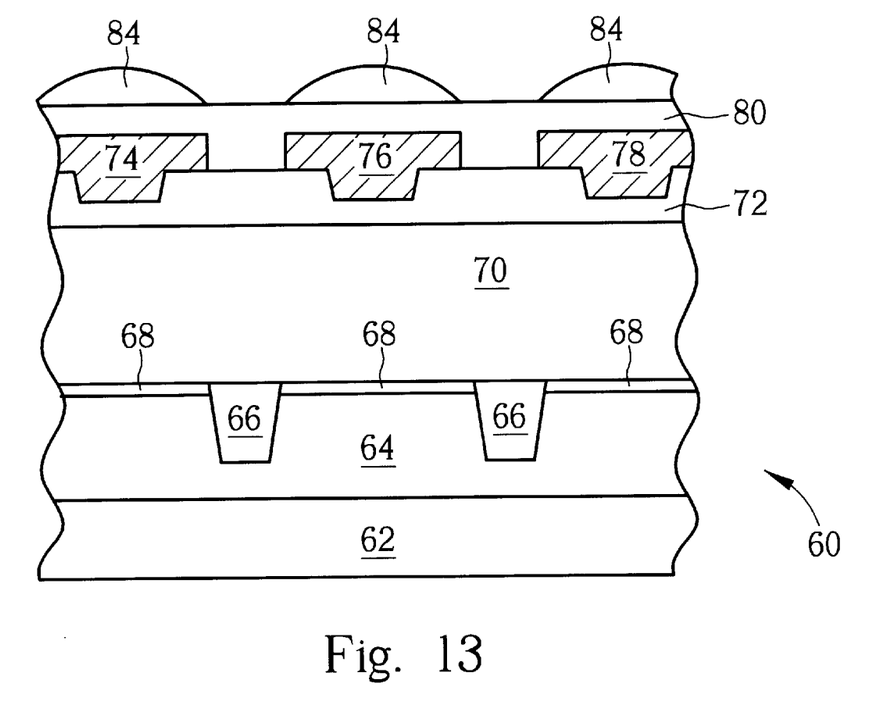

After the formation of each color filter 74, 76, 78, a U-lens is formed using a process of the prior art to accomplish the formation of a photosensor device. As shown in FIG. 12, an interlayer 80 is formed on the surface of the color filters 74, 76, 78, followed by the formation of a polymer layer 82 composed of acrylate material on the interlayer 80. Then, an exposure and development process is used to form patterns of U-lenses in the polymer layer 82. Finally, as shown in FIG. 13, U-lenses 84 corresponding to each MOS transistor sensor are formed following the annealing of the lens patterns.

The present invention method of forming a color filter array first involves forming each MOS transistor sensor, a dielectric layer and a passivation layer, respectively, on the surface of the semiconductor wafer. A recess is formed in the passivation layer and positioned above each corresponding MOS transistor sensor. Then, a color filter is formed sequentially in each recess. The recess is used to increase the contact areas between the color filter and the passivation layer so as to prevent stripping of the color filter.

In contrast to the color filter array produced by the prior art method, the color filter array produced by the present invention has the following advantages: (1) the contact areas between the color filters and the passivation layer are increased so as to enhance adhesion and prevent peeling of the color filters. (2) the depth of the recess can relatively increase the film thickness of the color filter formed in each recess so as to enhance the filter effect and prevent crosstalk.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of increasing adhesion of a color filter on a semiconductor wafer, the semiconductor wafer comprising a substrate, a plurality of metal-oxide semiconductor (MOS) transistor sensors positioned on the substrate, and a plurality of insulators positioned on the substrate, and each insulator positioned between each two MOS transistor sensors, the method comprising:

forming a dielectric layer on the semiconductor wafer and covering the MOS transistor sensors and the insulators;

forming a passivation layer on the dielectric layer; forming a plurality of recesses in the passivation layer, each recess being positioned over one of the MOS transistor sensors, respectively; and forming a color filter in each recess;

wherein the recess is used to increase the contact areas between the color filter and the passivation layer so as to prevent stripping of the color filter.

2. The method of claim 1 wherein the color filter is installed in an optic sensor apparatus.

3. The method of claim 1 wherein the MOS transistor sensors are complementary metal-oxide semiconductor (CMOS) transistor sensors.

4. The method of claim 1 wherein the insulators are field oxides (FOX) or shallow trench isolations (STI).

5. The method of claim 1 wherein the dielectric layer is composed of both a silicon-rich oxide (SRO) layer and a spin-on glass (SOG) layer.

6. The method of claim 1 wherein the passivation layer is formed of silicon-oxy-nitride.

7. The method of claim 1 wherein the method further comprises a process for forming a U-lens following the process for forming the color filter.

* * * * *